US008431827B2

(12) United States Patent
Nishikawa et al.

(10) Patent No.: US 8,431,827 B2
(45) Date of Patent: Apr. 30, 2013

(54) CIRCUIT MODULES AND METHOD OF MANAGING THE SAME (75) Inventors: Hiroshi Nishikawa, Nagaokakyo (JP); Taro Hirai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 28 days.

(21) Appl. No.: 13/155,463

(22) Filed: Jun. 8, 2011

(65) Prior Publication Data

US 2011/0239457 A1 Oct. 6, 2011

Related U.S. Application Data (63) Continuation of application No. PCT/JP2009/066907, filed on Sep. 29, 2009.

(30) Foreign Application Priority Data

Dec. 16, 2008 (JP) ................................. 2008-319852

(51) Int. Cl.
H05K 1/00 (2006.01)

(52) U.S. Cl.
USPC ............. 174/250; 174/538; 257/48; 257/620; 257/666; 257/678; 257/685; 257/691; 257/692; 257/723; 257/735; 257/738; 257/774; 257/777; 257/786; 257/797; 430/5; 430/22; 430/311; 435/6.11; 435/287.2; 438/14; 438/15; 438/57; 438/106; 438/112; 438/113; 438/114; 438/200; 438/401; 438/689; 429/122; 429/162; 355/53; 355/67; 355/77; 29/623.1; 29/623.5; 29/827

(58) Field of Classification Search ............. 174/250, 174/538; 257/48, 620, 666, 678, 685, 692, 257/723, 735, 738, 774, 777, 786, 797, 691; 430/5, 22, 311; 435/6.11, 287.2; 438/14, 438/15, 57, 106, 112–114, 200, 401, 689; 429/122, 162; 355/53, 67, 77; 29/623.1, 29/623.5, 827

See application file for complete search history.

(56) References Cited

U.S. PATENT DOCUMENTS 5,032,542 A * 7/1991 Kazami et al. .................. 29/827
5,171,703 A * 12/1992 Lin et al. ........................ 438/198

(Continued)

FOREIGN PATENT DOCUMENTS

JP 3-38654 U 4/1991
JP 05-218600 A 8/1993

(Continued)

OTHER PUBLICATIONS

Official Communication issued in International Patent Application No. PCT/JP2009/066907, mailed on Jan. 12, 2010.

Primary Examiner — Xiaoliang Chen
(74) Attorney, Agent, or Firm — Keating & Bennett, LLP (57) ABSTRACT Circuit modules including identification codes and a method of managing them are provided. A module substrate includes signal input output terminals and outer ground terminals provided at the peripheral portions of a surface which becomes a mounting surface when the circuit module is completed. An inner-ground-terminal formation area surrounded by the signal input output terminals and the outer ground terminals includes a plurality of inner ground terminals arranged in a matrix of rows and columns. One of the edge portions is a direction identification area. The inner ground terminal is not provided in the direction identification area, and a first identification code having information about the position of the module substrate is provided in the direction identification area.

7 Claims, 10 Drawing Sheets

U.S. PATENT DOCUMENTS

| | | | |
|---|---|---|---|
| 6,333,564 B1* | 12/2001 | Katoh et al. | 257/780 |
| 6,455,945 B1* | 9/2002 | Ishii et al. | 257/797 |
| 6,561,118 B2* | 5/2003 | Mead | 114/357 |
| 6,589,801 B1* | 7/2003 | Yoon et al. | 438/15 |
| 6,602,734 B1 | 8/2003 | Wada et al. | |
| 6,830,946 B2* | 12/2004 | Yanagisawa et al. | 438/26 |
| 7,002,667 B2* | 2/2006 | Levasier et al. | 355/69 |
| 7,022,437 B2* | 4/2006 | Cummings | 430/5 |
| 7,046,331 B2* | 5/2006 | Rossing et al. | 355/53 |
| 7,112,889 B1* | 9/2006 | Maruyama et al. | 257/797 |
| 2001/0032666 A1* | 10/2001 | Jenson et al. | 136/256 |
| 2001/0033952 A1* | 10/2001 | Jenson et al. | 429/7 |
| 2001/0042901 A1* | 11/2001 | Maruyama | 257/620 |
| 2002/0000034 A1* | 1/2002 | Jenson | 29/623.5 |
| 2002/0001746 A1* | 1/2002 | Jenson | 429/162 |
| 2002/0001747 A1* | 1/2002 | Jenson et al. | 429/162 |
| 2002/0004167 A1* | 1/2002 | Jenson et al. | 429/162 |
| 2002/0019066 A1* | 2/2002 | Iketani | 438/14 |
| 2002/0037756 A1* | 3/2002 | Jacobs et al. | 455/572 |
| 2002/0089052 A1* | 7/2002 | Yamaura et al. | 257/690 |
| 2002/0109825 A1* | 8/2002 | Gui et al. | 355/53 |
| 2002/0147520 A1* | 10/2002 | Mos et al. | 700/125 |
| 2002/0160368 A1* | 10/2002 | Bass et al. | 435/6 |
| 2002/0172876 A1* | 11/2002 | Baselmans | 430/22 |
| 2002/0178600 A1* | 12/2002 | Machida et al. | 33/645 |
| 2002/0182518 A1* | 12/2002 | Van Haren | 430/5 |
| 2002/0192598 A1* | 12/2002 | Hirayanagi | 430/311 |
| 2003/0001107 A1* | 1/2003 | Kroon et al. | 250/492.2 |
| 2003/0001256 A1* | 1/2003 | Sato et al. | 257/723 |
| 2003/0020184 A1* | 1/2003 | Ballarin | 257/797 |
| 2003/0034567 A1* | 2/2003 | Sato et al. | 257/786 |
| 2003/0199122 A1* | 10/2003 | Wada et al. | 438/113 |
| 2004/0026767 A1* | 2/2004 | Sato et al. | 257/678 |
| 2004/0036164 A1* | 2/2004 | Koike et al. | 257/723 |
| 2004/0038471 A1* | 2/2004 | Sakamoto et al. | 438/200 |
| 2004/0086424 A1* | 5/2004 | Schembri | 422/58 |
| 2004/0086869 A1* | 5/2004 | Schembri | 435/6 |
| 2004/0086871 A1* | 5/2004 | Schembri | 435/6 |
| 2004/0087008 A1* | 5/2004 | Schembri | 435/287.2 |
| 2004/0087009 A1* | 5/2004 | Schembri | 435/287.2 |
| 2004/0087033 A1* | 5/2004 | Schembri | 436/180 |
| 2004/0103917 A1* | 6/2004 | Heerens | 134/7 |
| 2004/0130022 A1* | 7/2004 | Shizuno | 257/735 |
| 2004/0137335 A1* | 7/2004 | Cummings | 430/5 |
| 2004/0137662 A1* | 7/2004 | Yanagisawa et al. | 438/127 |
| 2004/0156027 A1* | 8/2004 | Best et al. | 355/53 |
| 2004/0174511 A1* | 9/2004 | Gui et al. | 355/53 |
| 2004/0185310 A1* | 9/2004 | Jenson et al. | 429/7 |
| 2004/0185667 A1* | 9/2004 | Jenson | 438/689 |
| 2004/0187722 A1* | 9/2004 | Mos et al. | 101/463.1 |
| 2004/0201833 A1* | 10/2004 | Gui et al. | 355/67 |
| 2004/0206954 A1* | 10/2004 | Maruyama | 257/48 |
| 2004/0211922 A1* | 10/2004 | Kroon et al. | 250/492.2 |
| 2005/0009237 A1* | 1/2005 | Yamaguchi | 438/114 |
| 2005/0026323 A1* | 2/2005 | Wada et al. | 438/106 |
| 2005/0032267 A1* | 2/2005 | Liu et al. | 438/57 |
| 2005/0040545 A1* | 2/2005 | Van Haren | 257/797 |
| 2005/0042784 A1* | 2/2005 | Yanagisawa et al. | 438/28 |
| 2005/0045223 A1* | 3/2005 | Jenson et al. | 136/248 |
| 2005/0070068 A1* | 3/2005 | Kobayashi | 438/401 |
| 2005/0073031 A1* | 4/2005 | Abe et al. | 257/666 |
| 2005/0082683 A1* | 4/2005 | Yamaura et al. | 257/778 |
| 2005/0084772 A1* | 4/2005 | Ballarin | 430/5 |
| 2005/0085005 A1* | 4/2005 | Droz | 438/106 |
| 2005/0085009 A1* | 4/2005 | Yamaguchi et al. | 438/106 |
| 2005/0140951 A1* | 6/2005 | Van Buel et al. | 355/53 |
| 2005/0146699 A1* | 7/2005 | Levasier et al. | 355/53 |
| 2005/0146721 A1* | 7/2005 | Consolini et al. | 356/399 |
| 2005/0254030 A1* | 11/2005 | Tolsma et al. | 355/53 |
| 2005/0260796 A1* | 11/2005 | Takahashi | 438/112 |
| 2005/0286042 A1* | 12/2005 | Schoormans et al. | 355/77 |
| 2006/0019157 A1* | 1/2006 | Jenson | 429/162 |
| 2006/0021214 A1* | 2/2006 | Jenson et al. | 29/623.1 |
| 2006/0063074 A1* | 3/2006 | Jenson et al. | 429/322 |
| 2006/0113642 A1* | 6/2006 | Kajiki et al. | 257/659 |
| 2006/0138657 A1* | 6/2006 | Kushima | 257/737 |
| 2006/0138682 A1* | 6/2006 | Van Haren | 257/797 |
| 2006/0146307 A1* | 7/2006 | Hansen et al. | 355/67 |
| 2006/0202201 A1* | 9/2006 | Maruyama | 257/48 |
| 2006/0214294 A1* | 9/2006 | Fukasawa | 257/738 |
| 2006/0279003 A1* | 12/2006 | Maruyama et al. | 257/797 |
| 2007/0008238 A1* | 1/2007 | Liu et al. | 343/895 |
| 2007/0052106 A1* | 3/2007 | Watase et al. | 257/774 |
| 2007/0070229 A1* | 3/2007 | Shizuno | 348/294 |
| 2007/0087230 A1* | 4/2007 | Jenson et al. | 429/7 |
| 2007/0089113 A1 | 4/2007 | Kobayashi | |
| 2007/0212652 A1* | 9/2007 | Lalbahadoersing et al. | 430/314 |
| 2007/0243459 A1* | 10/2007 | Jenson et al. | 429/122 |
| 2007/0267736 A1* | 11/2007 | Shimanuki | 257/692 |
| 2008/0032203 A1* | 2/2008 | Phillipps et al. | 430/5 |
| 2008/0194060 A1* | 8/2008 | Shimanuki | 438/114 |
| 2008/0224293 A1* | 9/2008 | Hin | 257/685 |
| 2008/0251788 A1* | 10/2008 | Maruyama | 257/48 |
| 2009/0001849 A1* | 1/2009 | Tsuda | 310/313 R |
| 2009/0068556 A1* | 3/2009 | Jacobs et al. | 429/162 |
| 2009/0075422 A1* | 3/2009 | Machida | 438/106 |
| 2009/0075452 A1* | 3/2009 | Van Haren | 438/401 |
| 2009/0160065 A1* | 6/2009 | Haba et al. | 257/777 |
| 2010/0039044 A1* | 2/2010 | Hatakenaka et al. | 315/291 |
| 2010/0052191 A1* | 3/2010 | Trogisch et al. | 257/797 |
| 2011/0110057 A1* | 5/2011 | Nishikawa et al. | 361/765 |

FOREIGN PATENT DOCUMENTS

| | | |
|---|---|---|
| JP | 2001-156217 A | 6/2001 |
| JP | 2002-43703 A | 2/2002 |
| JP | 2003-188039 A | 7/2003 |
| JP | 2005-183939 A | 7/2005 |
| JP | 2005-277075 A | 10/2005 |
| JP | 2005-294635 A | 10/2005 |
| JP | 2007-42934 A | 2/2007 |

* cited by examiner

| ROW OR COLUMN | BIT REPRESENTATION 4321 | CORRESPONDING MARK (DOTS OF PATTERN ERASED EXCEPT FOR BLACK ONES) | |
|---|---|---|---|
| | | ROW | COLUMN |
| 1 | 0001 | ○ ○ ● <br> ○ | ○ <br> ○ ○ ● |
| 2 | 0010 | ○ ● ○ <br> ○ | ○ <br> ○ ● ○ |
| 3 | 0011 | ○ ● ● <br> ○ | ○ <br> ○ ● ● |
| 4 | 0100 | ● ○ ○ <br> ○ | ○ <br> ● ○ ○ |
| 5 | 0101 | ● ○ ● <br> ○ | ○ <br> ● ○ ● |
| 6 | 0110 | ● ● ○ <br> ○ | ○ <br> ● ● ○ |
| 7 | 0111 | ● ● ● <br> ○ | ○ <br> ● ● ● |
| 8 | 1000 | ○ ○ ○ <br> ● | ● <br> ○ ○ ○ |
| 9 | 1001 | ○ ○ ● <br> ● | ● <br> ○ ○ ● |
| 10 | 1010 | ○ ● ○ <br> ● | ● <br> ○ ● ○ |
| 11 | 1011 | ○ ● ● <br> ● | ● <br> ○ ● ● |
| 12 | 1100 | ● ○ ○ <br> ● | ● <br> ● ○ ○ |
| 13 | 1101 | ● ○ ● <br> ● | ● <br> ● ○ ● |
| 14 | 1110 | ● ● ○ <br> ● | ● <br> ● ● ○ |
| 15 | 1111 | ● ● ● <br> ● | ● <br> ● ● ● |
| 16 | 0000 | ○ ○ ○ <br> ○ | ○ <br> ○ ○ ○ |

SECOND IDENTIFICATION CODE

| SUBSTRATE NUMBER | REPRESENTATION |
|---|---|
| 1 | 01 |
| 2 | 02 |
| ⋮ | ⋮ |
| 9 | 09 |
| 10 | 0A |
| 11 | 0B |
| ⋮ | ⋮ |
| 32 | 0Z |
| 33 | 10 |
| 34 | 11 |
| ⋮ | ⋮ |
| 64 | 1Z |
| 65 | 20 |
| 66 | 21 |
| ⋮ | ⋮ |
| 76 | 2B |
| ⋮ | ⋮ |
| 97 | 2Z |
| 98 | 30 |
| 99 | 31 |
| 100 | 32 |
| ⋮ | ⋮ |
| 130 | 3Z |
| ⋮ | ⋮ |

| | |
|---|---|
| 1 | 01 |
| 2 | 02 |
| 3 | 03 |
| 4 | 04 |
| 5 | 05 |
| 6 | 06 |
| 7 | 07 |
| 8 | 08 |
| 9 | 09 |
| 10 | 0A |
| 11 | 0B |
| 12 | 0C |
| 13 | 0D |
| 14 | 0E |
| 15 | 0F |
| 16 | 0G |
| 17 | 0H |
| 18 | 0J |
| 19 | 0K |
| 20 | 0L |
| 21 | 0M |
| 22 | 0N |
| 23 | 0P |
| 24 | 0Q |
| 25 | 0R |
| 26 | 0T |
| 27 | 0U |
| 28 | 0V |
| 29 | 0W |
| 30 | 0X |
| 31 | 0Y |
| 32 | 0Z |

BIT REPRESENTATION

| ROW OR COLUMN | 8765 4321 | CORRESPONDING MARK (DOTS OF PATTERN ERASED EXCEPT FOR BLACK ONES) |
|---|---|---|
| 1 | 0000 0001 | ④ ③ ② ● / ⑧ ⑦ ⑥ ⑤ |
| 2 | 0000 0010 | ④ ③ ● ① / ⑧ ⑦ ⑥ ⑤ |
| 3 | 0000 0011 | ④ ③ ● ● / ⑧ ⑦ ⑥ ⑤ |
| 4 | 0000 0100 | ④ ● ② ① / ⑧ ⑦ ⑥ ⑤ |
| 5 | 0000 0101 | ④ ● ② ● / ⑧ ⑦ ⑥ ⑤ |
| 6 | 0000 0110 | ④ ● ● ① / ⑧ ⑦ ⑥ ⑤ |
| 7 | 0000 0111 | ④ ● ● ● / ⑧ ⑦ ⑥ ⑤ |
| 8 | 0000 1000 | ● ③ ② ① / ⑧ ⑦ ⑥ ⑤ |
| 9 | 0000 1001 | ● ③ ② ● / ⑧ ⑦ ⑥ ⑤ |
| 10 | 0000 1010 | ● ③ ● ① / ⑧ ⑦ ⑥ ⑤ |
| 11 | 0000 1011 | ● ③ ● ● / ⑧ ⑦ ⑥ ⑤ |
| 12 | 0000 1100 | ● ● ② ① / ⑧ ⑦ ⑥ ⑤ |
| 13 | 0000 1101 | ● ● ② ● / ⑧ ⑦ ⑥ ⑤ |
| 14 | 0000 1110 | ● ● ● ① / ⑧ ⑦ ⑥ ⑤ |
| 15 | 0000 1111 | ● ● ● ● / ⑧ ⑦ ⑥ ⑤ |
| 16 | 0001 0000 | ④ ③ ② ① / ⑧ ⑦ ⑥ ● |
| 17 | 0001 0001 | ④ ③ ② ● / ... |

CIRCUIT MODULES AND METHOD OF MANAGING THE SAME

BACKGROUND OF THE INVENTION

1. Field of the Invention

The present invention relates to circuit modules and methods of managing circuit modules, and more particularly, to circuit modules that include identification codes and methods of managing circuit modules.

2. Description of the Related Art

Methods of manufacturing various types of circuit modules include a method of forming a plurality of circuit modules at the same time as a mother substrate and dividing the mother substrate into individual circuit modules in a final stage.

Japanese Unexamined Patent Application Publication No. 2007-42934 discloses a method of managing the manufacturing histories of such circuit modules and mother substrates.

Figure 1:
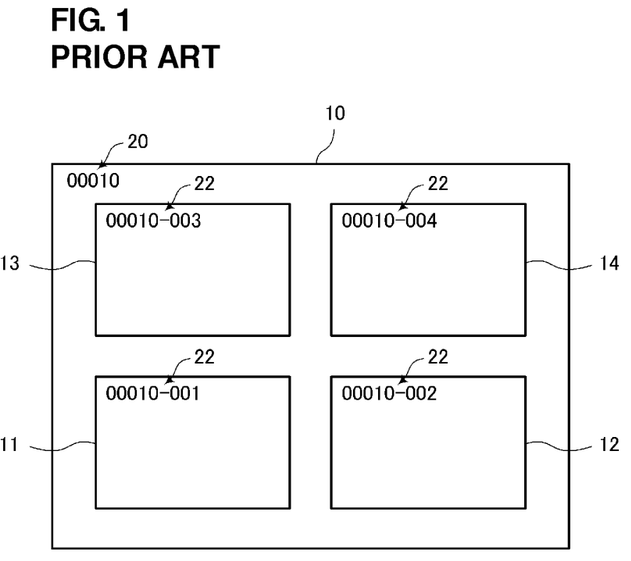
FIG. 1 illustrates a method of managing the history of manufacturing a multiple substrate and the multiple substrate disclosed in Japanese Unexamined Patent Application Publication No. 2007-42934.

Referring to FIG. 1, a method of managing the manufacturing histories of multiple substrates and the multiple substrates disclosed in Japanese Unexamined Patent Application Publication No. 2007-42934 is described.

A multiple substrate 10 illustrated in FIG. 1 is a substrate including, for example, four divided substrates 11 to 14, arranged in a matrix, to be separated into four substrates after components are mounted thereon. A substrate identification code (substrate ID) 20 is provided in a portion other than the divided substrates, and circuit identification codes (circuit IDs) 22 are provided on the divided substrates 11 to 14.

The substrate identification code 20 is unique so as not to be the same as that of another multiple substrate 10, and each of the circuit identification codes 22 includes the substrate identification code 20 as a portion thereof.

For example, when the substrate identification code 20 is [00010], the circuit identification codes 22 of the division substrates 11 to 14 may be [00010-001], [00010-002], [00010-003], and [00010-004].

However, when identification codes are to be provided, there has been a problem in that spaces for providing the identification codes are required, resulting in individual division substrates having increased sizes. Specifically, since many electrodes are formed on the back surfaces of the substrates, there has been a problem in that new spaces for providing the identification codes are required.

In addition, in the case where packaging using resin sealing is used instead of conventional metal caps to make circuit modules thinner, if identification codes are provided inside the resin seal, it is difficult to read the identification codes at the time of defect analysis.

Further, in the case of sealing with a resin, separation at the interface between a substrate and a sealing resin, for example, is a big problem in view of reliability. Hence, traceability that enables monitoring of occurrences of defects is required.

SUMMARY OF THE INVENTION

Accordingly, preferred embodiments of the present invention provide small circuit modules provided with identification codes and a method of managing such circuit modules.

A circuit module obtained by dividing a mother substrate including a plurality of circuit modules provided thereon, includes a module substrate, electrodes provided on a first main surface of the module substrate, and a resist layer provided on the first main surface of the module substrate, wherein the first main surface of the module substrate includes a direction identification area indicating a direction of the module substrate using partial formation/non-formation of the electrodes or partial formation/non-formation of the resist layer, and a first identification code including information about a position on the mother substrate of the module substrate is provided in the direction identification area.

This configuration makes it unnecessary to provide a new space for providing the first identification code, and reduces the size of the circuit module.

The first identification code is preferably represented using a dot pattern, for example.

This allows necessary resolution to be smaller than that for forming characters, thereby allowing the identification code to be formed in a limited space.

The first identification code is represented preferably using partial formation/non-formation of the electrodes or partial formation/non-formation of the resist layer.

This configuration allows the first identification code to be formed at the same time as electrode patterns are formed, or allows the first identification code to be formed at the same time as the resist layer is formed. Hence, an extra step for forming the first identification code is not required.

The first identification code is represented using partial formation/non-formation of the electrodes, and the direction identification area is covered with the resist layer.

This configuration reduces the likelihood of the first identification code being removed and recognition errors occurring when the direction identification area is recognized using light reflection.

The first main surface of the module substrate is a mounting surface of the circuit module, a plurality of components are provided on a second main surface, and the plurality of the components are sealed with a resin on the module substrate.

This makes a metal cap unnecessary, and enables thinning of the module. Further, the identification code can be easily read in a resin-sealed state. In other words, the structure is specifically appropriate for a resin-sealed circuit module.

A second identification code is provided on an external surface of the module substrate on the second surface side.

This allows the capability of identifying a circuit module to be enhanced by using two identification codes.

The second identification code preferably includes information about identification of the mother substrate.

As a result, a mother substrate can be identified using the second identification code and a position on the mother substrate can be identified. Although the second identification code varies with manufacturing, the first identification code can always be made to have a fixed pattern. Since the first identification code having a fixed pattern can be basically formed using a printing method, no additional costs are required. Further, since only a variable identification code is provided as the second identification code, the second identification code can be made to have a minimum number of digits or the like. Hence, the time per circuit module required to form the code using, for example, laser marking, is not long.

A method of managing circuit modules according to a preferred embodiment of the present invention is configured as follows.

Circuit modules are managed by forming a plurality of circuit modules on a mother substrate, forming a first identification code including information about a position on the mother substrate of the circuit module, in a direction recognition area in each module substrate portion of the mother substrate, dividing the mother substrate into the module substrate portions, and obtaining the information about the position on the mother substrate of the circuit module by reading the first identification code.

This method allows management of positions on the mother substrate from which the circuit modules have been cut, resulting in enhanced defect analysis capability and traceability, for example.

According to a preferred embodiment of the present invention, it becomes unnecessary to provide a new space for providing the first identification code, and the size of the circuit module is reduced. In addition, positions on the mother substrate from which the circuit modules have been cut can be managed, resulting in enhanced defect analysis capability and traceability, for example.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Circuit modules according to a first preferred embodiment will be described with reference to FIGS. 2 to 6B.

Figure 2:
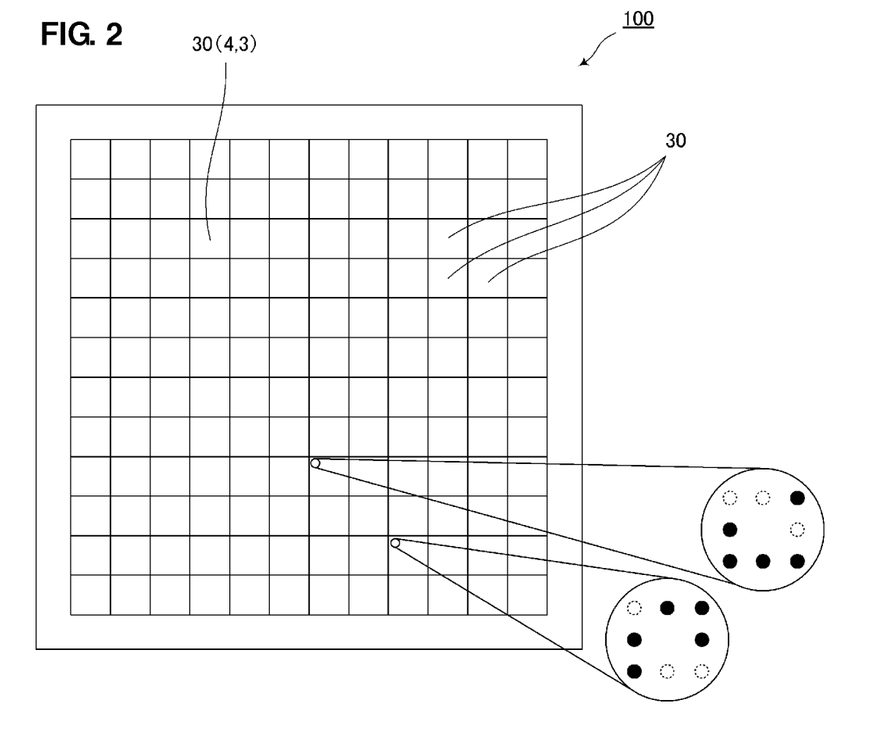
FIG. 2 is a plan view of a state of a mother substrate during the course of manufacturing circuit modules according to a first preferred embodiment of the present invention.

FIG. 2 is a plan view of a state of a mother substrate during the course of manufacturing circuit modules according to the first preferred embodiment. A mother substrate 100 includes a plurality of module substrate portions 30. In this example, the module substrate portions are preferably arranged in 12 rows by 12 columns, and 144 circuit modules are obtained later by dividing the mother substrate 100.

Figure 3:
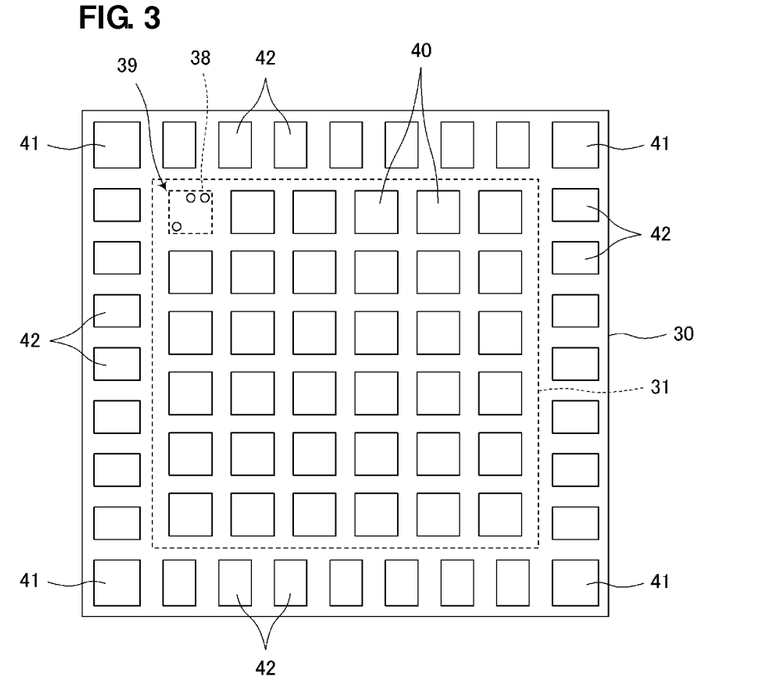
FIG. 3 is a plan view of the configuration of one of the module substrate portions 30, and is a plan view of the mounting surface side of the circuit module in a completed state.

FIG. 3 is a plan view of the configuration of one of the module substrate portions 30, and is a plan view of the mounting surface side (first main surface side) of the circuit module in a completed state. Signal input output terminals 42 are provided in the peripheral portions (four sides) of the module substrate 30. Outer ground terminals 41 are provided at the four edges of the module substrate 30.

Note that the signal input output terminals may be provided at all or some of the four edges of the module substrate 30. This is also true in other preferred embodiments described below.

The inside area of the module substrate 30 surrounded by the signal input output terminals 42 and the outer ground terminals 41 is an inner-ground-terminal formation area 31. The inner-ground-terminal formation area 31 includes a plurality of inner ground terminals 40 arranged in a matrix of rows and columns.

Note that the terminals provided in the inside area surrounded by the signal input output terminals 42 and the outer ground terminals 41 are not limited to the ground terminals, and may be other terminals or electrodes. For example, signal input terminals may be formed there.

In this example, the inner-ground-terminal formation area 31 includes the inner ground terminals 40 arranged in six rows and six columns. One of the edge portions is a direction identification area 39, and does not include the inner ground terminal 40 provided therein. In the direction identification area 39, a first identification code that includes the position information of the module substrate 30 is provided, as will be described in detail later.

Figure 4:
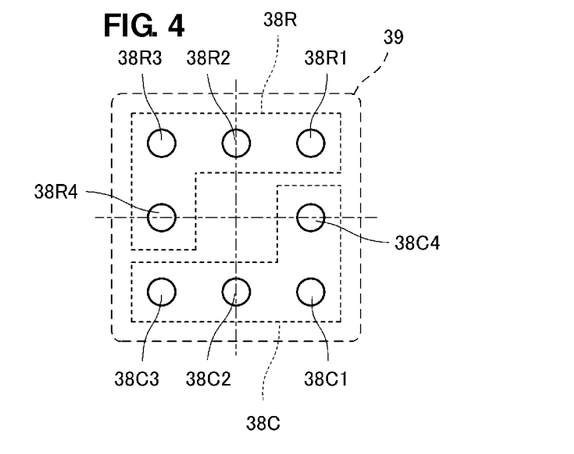
FIG. 4 is a diagram illustrating the configuration of a first identification code indicating the position on the mother substrate 100 of the module substrate 30 provided in the direction identification area 39.

FIG. 4 is a diagram illustrating the configuration of the first identification code indicating the position on the mother substrate 100 of the module substrate 30 provided in the direction identification area 39. Here, four dot formation areas 38R1, 38R2, 38R3, and 38R4 make up row position information 38R, for example. Four dot formation areas 38C1, 38C2, 38C3, and 38C4 make up column position information 38C, for example.

The four dots in the dot formation areas 38R1 to 38R4 make up a 4-bit binary code indicating row information, and the four dots in the areas 38C1 to 38C4 make up a 4-bit binary code indicating column information. Note that the dots are preferably formed of electrodes, for example.

For example, in the case of the first identification code formed in the direction identification area 39 illustrated in FIG. 3, the bits of (row, column) are (0011, 0100), representing the third row and fourth column. In other words, it can be seen that this is a module substrate in the module substrate area 30 (4, 3) illustrated in FIG. 2.

Figure 5:
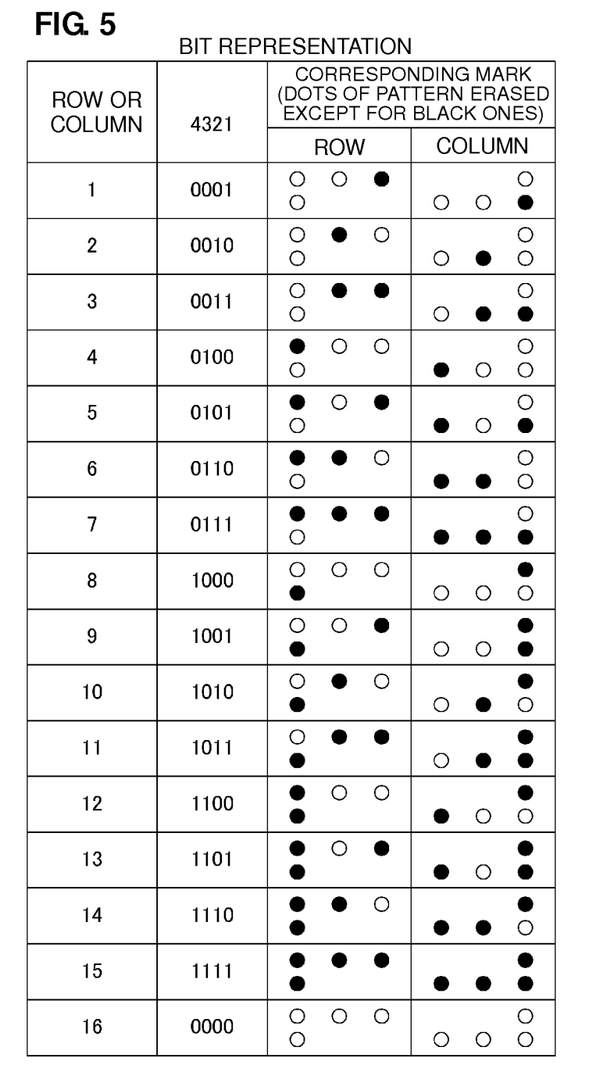
FIG. 5 illustrates the relationship between the pattern and information of the first identification code.

FIG. 5 illustrates the relationship between the pattern and information of the first identification code. Here, the row position information and the column position information are illustrated at the same time. In FIG. 5, "row or column"

represents a row number or a column number in decimal, "bit representation" is a 4-bit binary code, and "corresponding mark" is the pattern corresponding to the row position information 38R or the column position information 38C illustrated in FIG. 4.

In this manner, the positions of module substrates with 16 rows and 16 columns maximum are represented.

The manufacturing steps for circuit modules based on the mother substrate illustrated in FIG. 2 are given below.

(1) Mount predetermined electronic components on a component mounting surface (a surface on the backside when viewed as in FIG. 2) of the mother substrate 100 illustrated in FIG. 2.

(2) Seal the entirety of the component mounting surface of the mother substrate 100 using an insulating resin.

(3) Form grooves having a depth from the resin sealed surface to the center of the mother substrate 100 in the width direction, along the boundary lines of the module substrates 30.

(4) Apply conductive paste on the surface of the resin for sealing and dry and harden the conductive paste.

(5) Then, provide a second identification code including identification information (identification information representing which mother substrate the circuit module is cut from) to identify the mother substrate at a position on the front surface (surface opposite the mounting surface).

(6) Finally, cut the whole mother substrate 100 to obtain individual circuit modules.

Figure 6A:
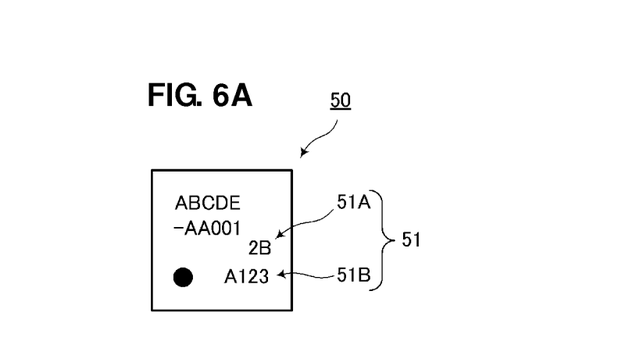
FIG. 6A is a plan view of a circuit module 50 and FIG. 6B illustrates a second identification code 51 and the content thereof.
Figure 6B:
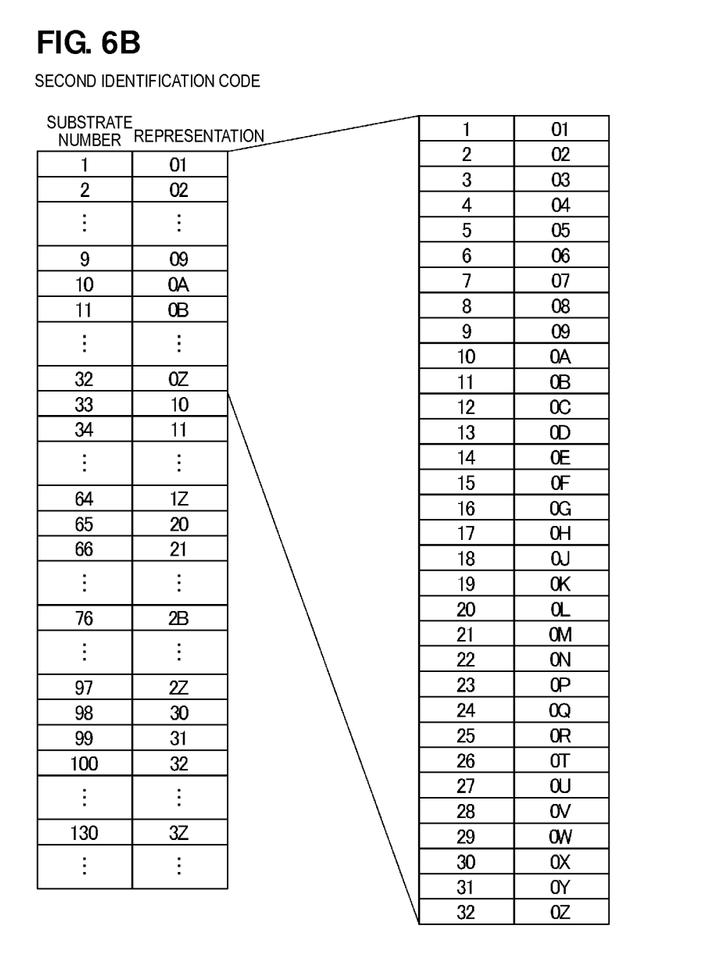

FIG. 6A is a plan view of a circuit module 50 manufactured though the manufacturing steps described above. FIG. 6B illustrates the second identification code 51A and the content thereof.

As illustrated in FIG. 6A, the circuit module 50 includes the second identification code 51 made up of a mother substrate number 51A and a manufacturing number 51B formed on the front surface (external surface on the second main surface side of the module substrate) thereof using laser marking. Here, the manufacturing number 51B represents a manufacturing lot, and the mother substrate number 51A represents the serial number of a mother substrate manufactured in a given manufacturing factory during a given manufacturing period.

As illustrated in FIG. 6B, the second identification code represents the substrate number of a mother substrate using alphanumeric characters 0 to 9 and A to Z. For example, referring to FIG. 6A, when the second identification code 51 is 2B, this means that the circuit module 50 has been cut from the 76th mother substrate.

Note that in the configuration illustrated in FIG. 3, areas (inter-electrode areas) other than electrode formation areas may be covered with a resist layer. In that case, the direction identification area 39 may be covered entirely with a resist layer so as to cover the surface of the dot electrodes which make up the first identification code 38.

This results in an advantage in that the electrodes are prevented from being removed and recognition errors are unlikely to occur when the position of the direction identification area is recognized on the basis of a difference in the amount of light reflected.

In addition, although sealing is preferably performed using a resin in the example described above, the present invention can be applied to the case in which sealing is performed using a metal case (cap) instead of using a resin. This is also true in other preferred embodiments described later.

Second Preferred Embodiment

Figure 7A:
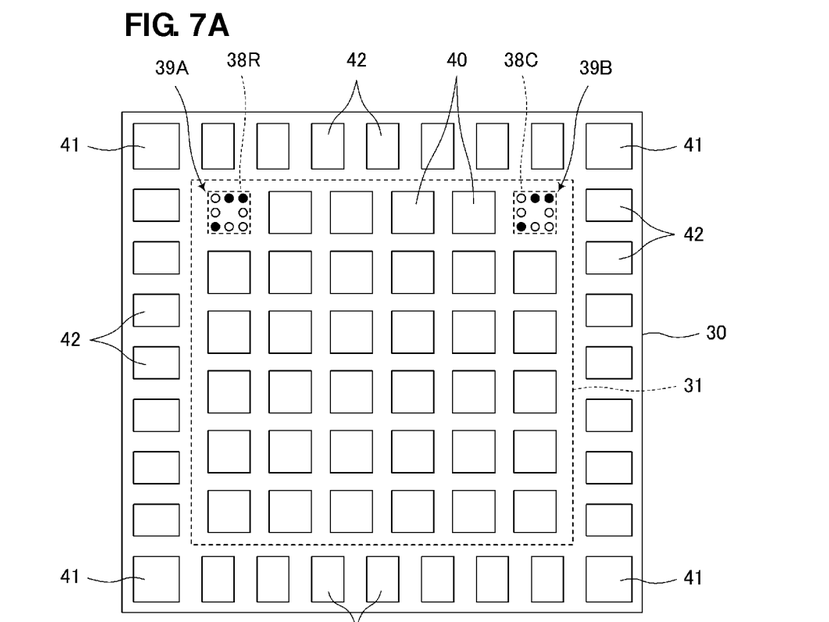
FIGS. 7A and 7B are mounting surface side plan views of two types of circuit module according to a second preferred embodiment of the present invention.
Figure 7B:
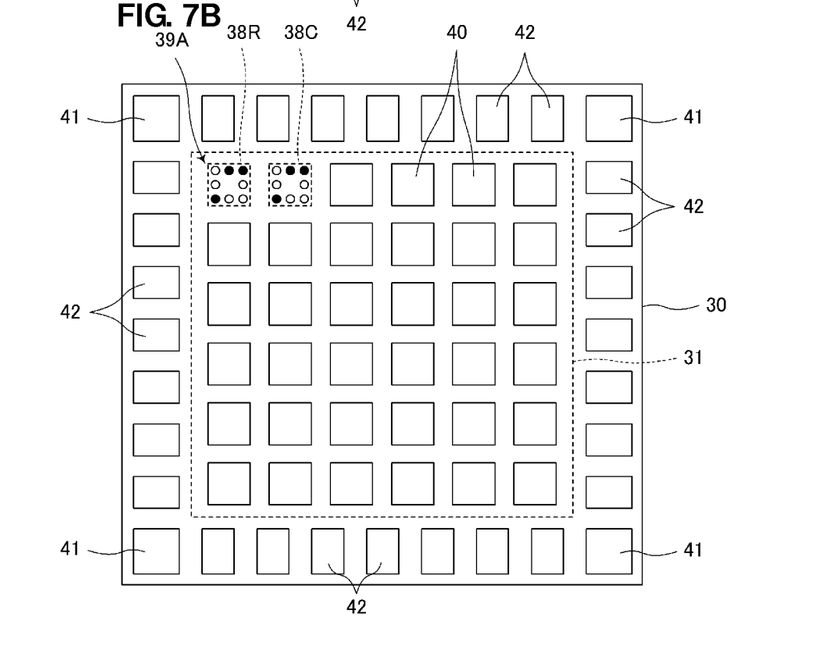

FIGS. 7A and 7B are mounting surface side plan views of two types of circuit module according to a second preferred embodiment of the present invention.

In the example of FIG. 7A, two direction identification areas 39A and 39B are provided in the inner-ground-terminal formation area 31. The direction identification area 39A includes the row position information 38R provided therein. The direction identification area 39B includes the column position information 38C provided therein.

In this manner, the first identification codes may be formed using a plurality of areas of the inner ground terminals 40.

Third Preferred Embodiment

Figure 8:
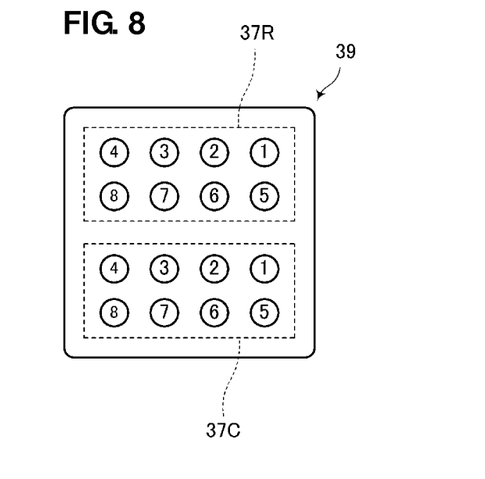
FIG. 8 illustrates the configuration of the first identification code used in a circuit module according to a third preferred embodiment of the present invention.

FIG. 8 illustrates the configuration of the first identification code used in a circuit module according to a third preferred embodiment of the present invention. The first identification code includes row position information 37R and column position information 37C. The numerals within circles indicate bit positions.

In this manner, the direction identification area 39 may include 8-bit row position information and 8-bit column information.

Figure 9:
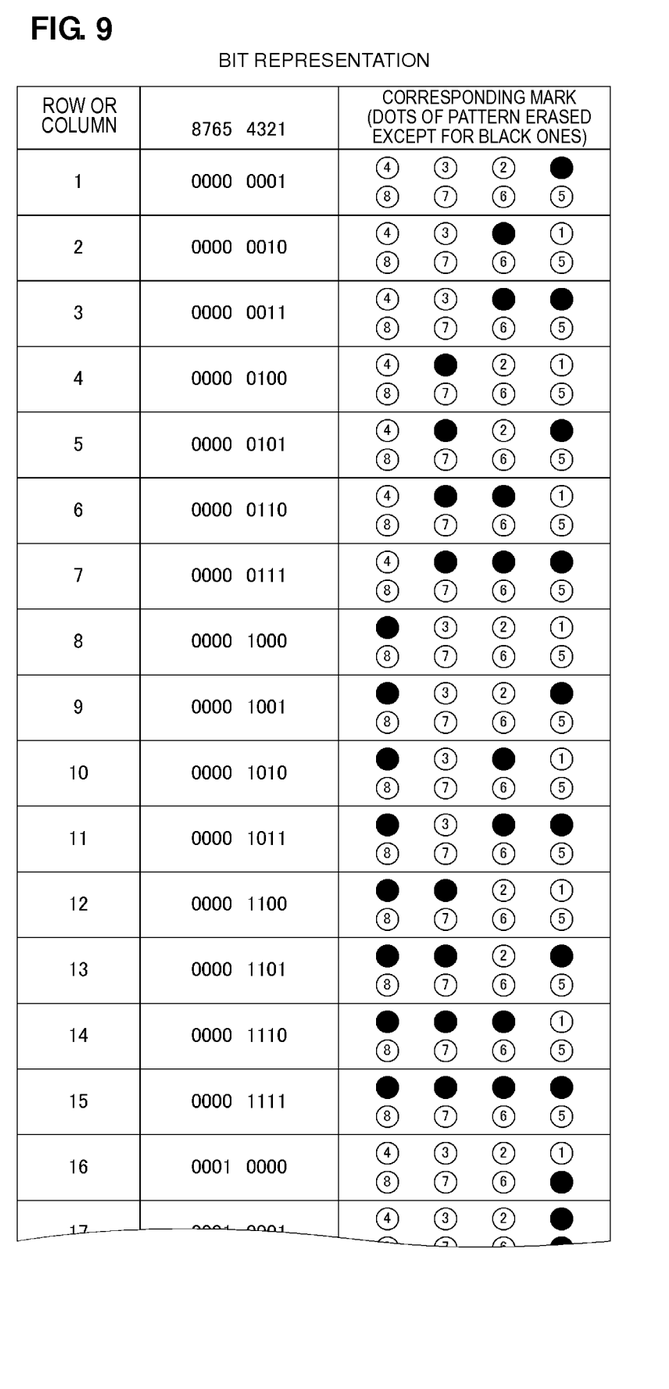
FIG. 9 illustrates the relationship between the pattern and information of the first identification code illustrated in FIG. 8.

FIG. 9 illustrates the relationship between the pattern and information of the first identification code illustrated in FIG. 8. Here, the row position information and the column position information are illustrated at the same time. In FIG. 9, "row or column" represents a row number or a column number in decimal, "bit representation" is a 8-bit binary code, and "corresponding mark" is the pattern corresponding to the row position information 38R or the column position information 38C illustrated in FIG. 8.

In this manner, the positions of module substrates with 255 rows and 255 columns maximum are represented, for example.

Fourth Preferred Embodiment

Figure 10:
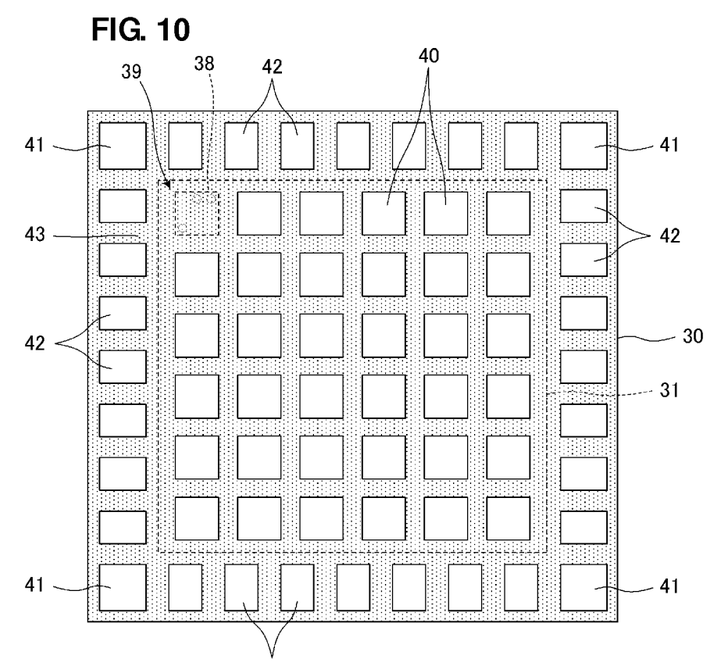
FIG. 10 is a plan view of the substrate mounting surface side of a circuit module according to a fourth preferred embodiment of the present invention.

FIG. 10 is a plan view of the substrate mounting surface side of a circuit module according to a fourth preferred embodiment, and is a plan view of the mounting surface side (first main surface side) of the circuit module in a completed state. The signal input output terminals 42 are provided in the peripheral portions (four sides) of the module substrate 30. The outer ground terminals 41 are provided at the four edges of the module substrate 30.

The inside area of the module substrate 30 surrounded by the signal input output terminals 42 and the outer ground terminals 41 is the inner-ground-terminal formation area 31. The inner-ground-terminal formation area 31 includes a plurality of the inner ground terminals 40 individually provided therein. A resist layer 43 is provided between these electrodes.

The direction identification area 39, in which the inner ground terminal 40 is not provided, includes the first identification code 38 provided therein preferably using dot pattern electrodes. The whole direction identification area 39 including the surface of the first identification code 38 defined by dot pattern electrodes is covered with the resist layer 43.

This results in an advantage in that the electrodes are prevented from being removed and recognition errors are unlikely to occur when the position of the direction identification area is recognized using a difference in the amount of light reflected by the area.

Fifth Preferred Embodiment

Figure 11:
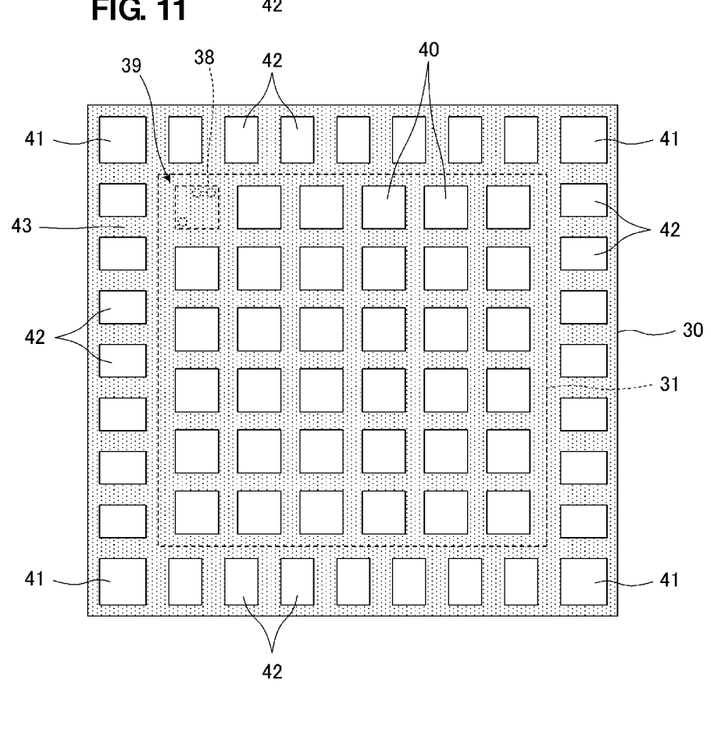
FIG. 11 is a plan view of the substrate mounting surface side of a circuit module according to a fifth preferred embodiment of the present invention.

FIG. 11 is a plan view of the substrate mounting surface side of a circuit module according to a fifth preferred embodiment, and is a plan view of the mounting surface side (first main surface side) of the circuit module in a completed state. The signal input output terminals 42 are provided in the peripheral portions (four sides) of the module substrate 30. The outer ground terminals 41 are provided at the four edges of the module substrate 30.

The inside area of the module substrate 30 surrounded by the signal input output terminals 42 and the outer ground terminals 41 is the inner-ground-terminal formation area 31. The inner-ground-terminal formation area 31 includes a continuous ground electrode provided therein. However, the first identification code 38 is provided in the direction identification area 39 using partial openings (cut pattern) in the ground electrode.

The inner ground terminals 40 are provided using partial openings in the resist layer 43 in the area of the inner-ground-terminal formation area 31 other than the direction identification area 39.

The resist layer 43 is also provided between the neighboring signal input output terminals 42 and between the outer ground terminals 41 and the signal input output terminals 42.

The whole direction identification area 39, including the surface of the first identification code 38 using the cut pattern of the ground electrode, is covered with the resist layer 43.

This results in an advantage in that the electrodes are prevented from being removed and recognition errors are unlikely to occur when the position of the direction identification area is recognized using a difference in the amount of light reflected by the area.

Sixth Preferred Embodiment

Figure 12:
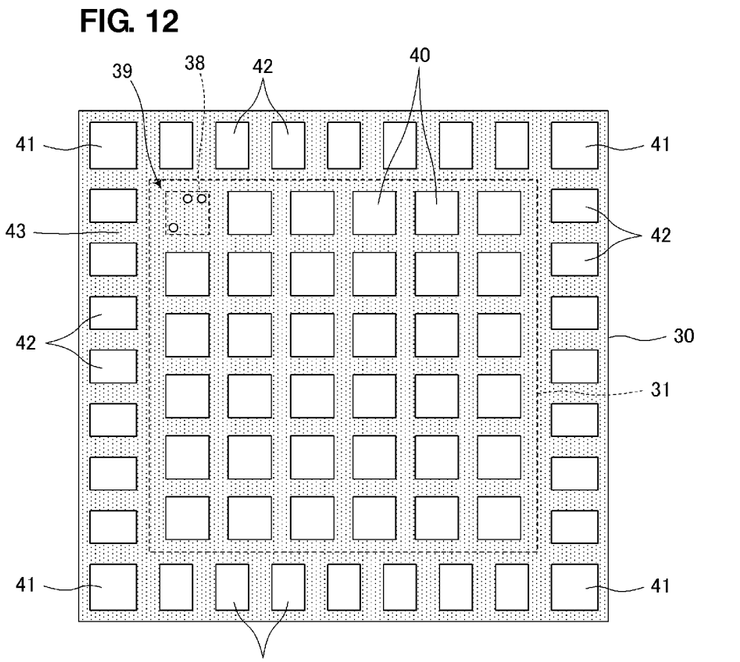
FIG. 12 is a plan view of the substrate mounting surface side of a circuit module according to a sixth preferred embodiment of the present invention.

FIG. 12 is a plan view of the substrate mounting surface side of a circuit module according to a sixth preferred embodiment, and is a plan view of the mounting surface side (first main surface side) of the circuit module in a completed state. The signal input output terminals 42 are provided in the peripheral portions (four sides) of the module substrate 30. The outer ground terminals 41 are provided at the four edges of the module substrate 30.

The inside area of the module substrate 30 surrounded by the signal input output terminals 42 and the outer ground terminals 41 is the inner-ground-terminal formation area 31. The inner-ground-terminal formation area 31 includes a continuous ground electrode provided therein. The inner-ground-terminal formation area 31 includes the inner ground terminals 40 provided therein using a plurality of openings in the resist layer 43. However, the first identification code 38 is preferably formed in the direction identification area 39 using partial openings (cut pattern) in the resist layer.

In this manner, the first identification code may be formed using the pattern of the resist layer. This configuration reduces the likelihood of the first identification code 38 being removed.

Seventh Preferred Embodiment

Figure 13:
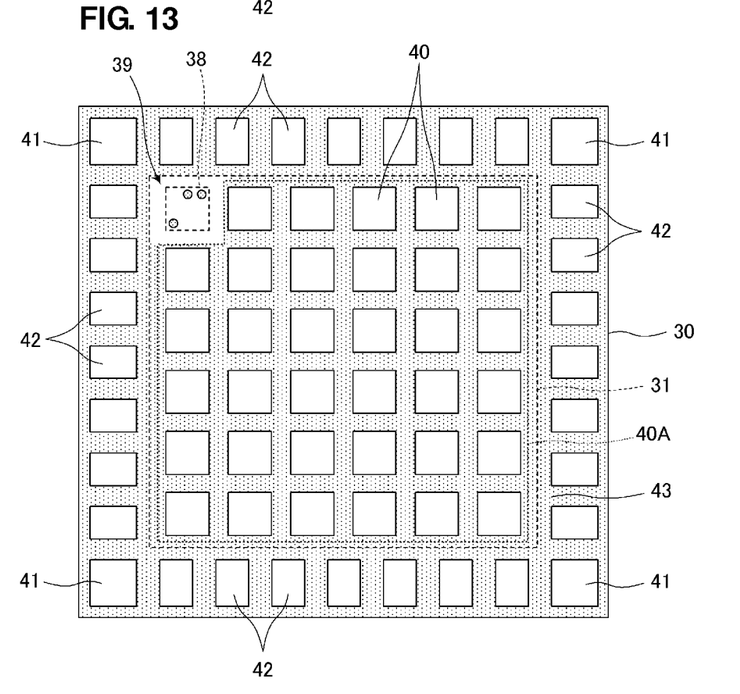
FIG. 13 is a plan view of the mounting surface side of a circuit module according to a seventh preferred embodiment of the present invention.

FIG. 13 is a plan view of the mounting surface side of a circuit module according to a seventh preferred embodiment. In this example, in the inner-ground-terminal formation area 31, a continuous ground electrode 40A is provided, the inner ground terminals 40 are formed using openings in the resist layer 43, and the first identification code 38 is formed using a pattern of the resist layer. In the peripheral portions (the direction identification area 39) of the first identification code 38, where a ground terminal is not provided, the first identification code 38 is formed using only the resist layer.

Note that although examples in which the first identification code is represented using a dot pattern have been shown in the preferred embodiments described above, the dot pattern is not limited to a pattern of round dots and may be a pattern of square dots. By using a pattern of dots having various shapes, more positions can be represented using fewer dots. For example, eight dots illustrated in FIG. 5 can be used to represent or identify position information in a range exceeding 16 rows×16 columns.

Further, in the case in which manufacturing conditions, circuit configurations, or the like are set differently in accordance with the types of mother substrate or module substrate, the shapes of dots in the dot pattern of the first identification code may be made to be different accordingly. In this manner, manufacturing conditions, circuit configurations, or the like may be easily identified. Examples of various shapes usable for the dots of a pattern include a circle, a rectangle, a triangle, a cross, and a hexagon.

The first identification code may be a bar-type code, not limited to a dot pattern. Further, the first identification code may be a one-dimensional or two-dimensional bar code, not limited to a binary code. The first identification code may include characters, but by using dots or bars, the code can be advantageously provided in a limited space.

Eighth Preferred Embodiment

A method of managing circuit modules according to a preferred embodiment of the present invention will now be described with reference to the flowcharts illustrated in FIGS. 14A-14C.

Figure 14A:
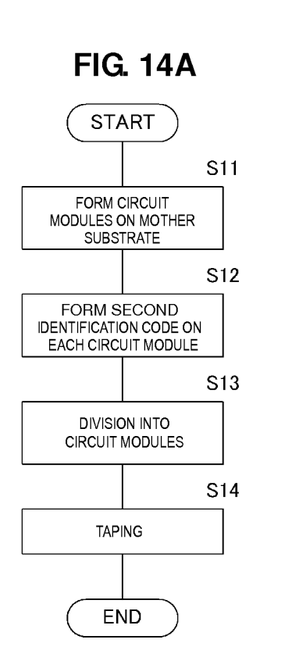
FIG. 14A a flowchart illustrating the steps of a method of manufacturing circuit modules.

FIG. 14A is a flowchart illustrating the steps of a method of manufacturing circuit modules. As illustrated, for example, in FIG. 2 in the first preferred embodiment, a plurality of circuit modules are formed on the mother substrate 100 (S11). Then, the second identification code is formed on the front side of each of the circuit modules using a laser marking method (S12). Then, the mother substrate is divided into the plurality of circuit modules and they are taped so as to be appropriate for a predetermined component feeder (S13→S14).

Figure 14B:
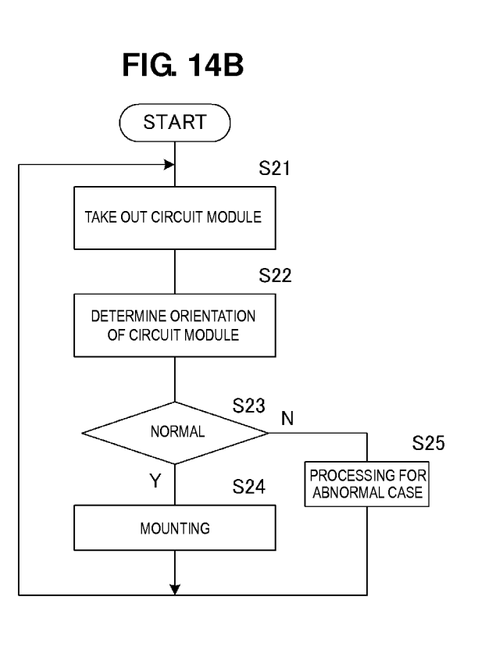
FIG. 14B is a flowchart illustrating the steps of mounting the circuit modules.

FIG. 14B is a flowchart illustrating the steps of mounting the circuit modules. First, a circuit module is taken out of a tape feeder, and the orientation of the circuit module is recognized on the basis of the position of the direction identification area (S21→S22). This is performed, in a state in which the circuit module is being sucked by a vacuum chuck, by capturing the image of the mounting surface side of the circuit module using a camera, and through image recognition. The circuit module, when normal, is mounted on a mounting substrate (S23→S24). When the orientation is abnormal, processing for an abnormal case, such as rejection, is performed for the circuit module (S25). By repeating the above-described steps, the circuit modules are mounted.

Figure 14C:
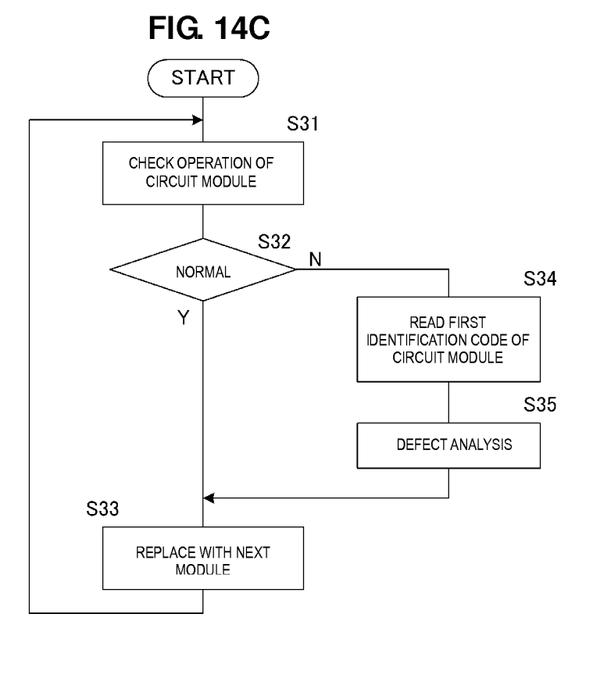
FIG. 14C is a flowchart illustrating the steps for an operation check and defect analysis performed for the circuit modules.

FIG. 14C is a flowchart illustrating the steps for an operation check and defect analysis performed for the circuit modules. First, a circuit module is connected to an operation check apparatus, where the operation check is automatically performed (S31). When the circuit module is normal, it is replaced with a next circuit module, and the same processing steps are repeated (S32→S33→S31).

When the circuit module is abnormal, the first identification code on the mounting surface side of the circuit module is read, so as to determine the position on the mother substrate from which the circuit module has been cut. Then defect analysis for that circuit module is performed (S34→S35). In this manner, statistical management of the relationship (distribution or the like) between the positions on a mother substrate and defect rates or defect modes can be performed.

In addition, by reading the second identification code on the front surface side of a circuit module, it can be determined from which circuit module the mother substrate has been cut.

In this manner, the manufacturing time of the circuit module, the mother substrate and the position on the mother substrate from which the circuit module has been cut can be made to be the objects of management, resulting in increased traceability. Note that the identification code can be read by image recognition or using a laser and a microscope.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A circuit module obtained by dividing a mother substrate including a plurality of circuit modules provided thereon, the circuit module comprising:
    a module substrate;
    electrodes provided on a first main surface of the module substrate; and
    a resist layer provided on the first main surface of the module substrate; wherein the first main surface of the module substrate includes a direction identification area indicating a direction of the module substrate using partial formation/non-formation of the electrodes or partial formation/non-formation of the resist layer;
    signal input/output terminals are provided in peripheral portions of the module substrate;
    inner ground terminals are arranged inside an area surrounded by the signal input/output terminals in a matrix of rows and columns;
    the direction identification area is at least one portion of the area in which the inner ground terminals are arranged; and
    a first identification code including information about a position on the mother substrate of the module substrate is provided in the direction identification area.

2. The circuit module according to claim 1, wherein the first identification code is represented using a dot pattern.

3. The circuit module according to claim 1, wherein the first identification code is represented using partial formation/non-formation of the electrodes or partial formation/non-formation of the resist layer.

4. The circuit module according to claim 1, wherein the first identification code is represented using partial formation/non-formation of the electrodes, and the direction identification area is covered with the resist layer.

5. The circuit module according to claim 1, wherein the first main surface of the module substrate is a mounting surface of the circuit module, a plurality of components are provided on a second main surface of the circuit module, and the plurality of the components are sealed with a resin on the module substrate.

6. The circuit module according to claim 1, wherein a second identification code is provided on an external surface of the module substrate on a second surface side.

7. The circuit module according to claim 6, wherein the second identification code includes information about identification of the mother substrate.

* * * * *